(12) United States Patent
Chen (10) Patent No.: US 11,380,716 B2
(45) Date of Patent: Jul. 5, 2022

(54) ARRAY SUBSTRATE AND MANUFACTURING METHOD THEREOF

(71) Applicant: TCL China Star Optoelectronics Technology Co., Ltd., Shenzhen (CN)

(72) Inventor: Meng Chen, Shenzhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 216 days.

(21) Appl. No.: 16/648,259

(22) PCT Filed: Nov. 11, 2019

(86) PCT No.: PCT/CN2019/117112
§ 371 (c)(1),
(2) Date: Mar. 18, 2020

(87) PCT Pub. No.: WO2021/077477
PCT Pub. Date: Apr. 29, 2021

(65) Prior Publication Data
US 2022/0052076 A1    Feb. 17, 2022

(30) Foreign Application Priority Data

Oct. 25, 2019  (CN) .......................... 201911020554.7

(51) Int. Cl.
*H01L 27/00*    (2006.01)
*H01L 29/00*    (2006.01)
*H01L 27/12*    (2006.01)

(52) U.S. Cl.
CPC ........ *H01L 27/124* (2013.01); *H01L 27/1262* (2013.01); *H01L 27/1225* (2013.01); *H01L 27/1248* (2013.01)

(58) Field of Classification Search
CPC ............... H01L 27/124; H01L 27/1262; H01L 27/1225; H01L 27/1248; H01L 27/1244; H01L 29/4908; H01L 29/78618; H01L 29/6675; H01L 29/78696; H01L 29/78648
See application file for complete search history.

(56) References Cited

U.S. PATENT DOCUMENTS

| 10,235,930 B2 * | 3/2019 | Saotome | H01L 27/1225 |
| 10,847,545 B2 * | 11/2020 | Lee | H01L 27/124 |
| 2013/0252384 A1 | 9/2013 | Ryu et al. | |
| 2015/0311213 A1 * | 10/2015 | Hwang | H01L 29/7926 |
| | | | 257/326 |

FOREIGN PATENT DOCUMENTS

| CN | 101123211 | 2/2008 |
| CN | 101197312 | 6/2008 |
| CN | 103646924 | 3/2014 |

* cited by examiner

*Primary Examiner* — Nikolay K Yushin (57) ABSTRACT

An array substrate and manufacturing method thereof are provided. The array substrate includes: a substrate; a first gate electrode insulating layer disposed on the substrate, wherein the first gate electrode insulating layer has a recess therein; a gate electrode layer disposed in the recess of the first gate electrode insulating layer; a second gate electrode insulating layer covering the first gate electrode insulating layer and the gate electrode layer; and an active layer disposed on the second gate electrode insulating layer.

15 Claims, 5 Drawing Sheets

ARRAY SUBSTRATE AND MANUFACTURING METHOD THEREOF

RELATED APPLICATIONS

This application is a National Phase of PCT Patent Application No. PCT/CN2019/117112 having International filing date of Nov. 11, 2019, which claims the benefit of priority of Chinese Patent Application No. 201911020554.7 filed on Oct. 25, 2019. The contents of the above applications are all incorporated by reference as if fully set forth herein in their entirety.

FIELD AND BACKGROUND OF THE INVENTION

The present disclosure relates to a technical field of display panels, and more particularly to an array substrate and manufacturing method thereof.

Flat panel display devices have advantages of having thin bodies, being power saving, and having no radiation, have been widely used. Existing flat panel display devices mainly include liquid crystal displays (LCDs) or organic light emitting diode displays (OLED). Array substrates are important components of flat panel display devices. Array substrates can be formed on glass substrates or plastic substrates. Array substrates are generally used as light-emitting devices or driving devices for LCDs or OLEDs, etc.

As resolutions of display panels are raised and sizes of display panels increase, a signal delay phenomenon becomes more serious. It is urgently desired to decrease wiring resistance. Copper (Cu) is second only to silver (Ag) in conductivity. Raw material of Cu is inexpensive. Cu is considered to be the most promising low-resistivity wiring material. In related art, Cu material is used as material of gate electrodes of thin film transistors (TFTs).

In advanced generation liquid crystal panels, using Cu material instead of conventional aluminum to serve as gate electrode metal lines has become a trend because Cu material have advantages such as low impedance and high electromigration resistance. As panel sizes are enlarged and resolutions are increased, using common Cu wire thickness of 3000 Å to solve problems such as circuit delay becomes harder and harder. Therefore, one direction for solving the problems is to increase thickness of Cu wires.

As thickness of Cu wires increases, because of step coverage problems, increase of thickness of Cu film layers in gate electrode structures cause thickness of gate electrode insulating layers to increase. In this way, ON-state current of array substrates is decreased, thereby increasing risks of insufficient panel charging rates.

Hence, it is desired to develop a novel array substrate manufacturing method to overcome deficiencies in the related art.

SUMMARY OF THE INVENTION

Technical problems are as follows.

An object of the present disclosure is to provide an array substrate that can solve a problem that thickness of a gate electrode insulating layer is increased due to increase of a thickness of a copper (Cu) film in a gate electrode structure.

Technical solutions are as follows.

In order to achieve the aforementioned object, the present disclosure provides an array substrate including: a substrate; a first gate electrode insulating layer disposed on the substrate, wherein the first gate electrode insulating layer has a recess therein; a gate electrode layer disposed in the recess of the first gate electrode insulating layer; a second gate electrode insulating layer covering the first gate electrode insulating layer and the gate electrode layer; and an active layer disposed on the second gate electrode insulating layer.

Further, in other embodiments, the array substrate further includes: a source or drain electrode layer disposed on the active layer; a planarization layer disposed on the source or drain electrode layer; and a pixel defined layer disposed on the planarization layer.

Further, in other embodiments, the gate electrode layer has a Cu material. A range of a thickness of the gate electrode layer is from 200 nm to 5000 nm.

Further, in other embodiments, each of the first gate electrode insulating layer and the second gate electrode insulating layer has at least one or at least two of a corresponding nitrogen oxide material, a corresponding silicon oxide material, and a corresponding silicon nitride material. A range of a thickness of the first gate electrode insulating layer is from 100 nm to 500 nm, and a range of a thickness of the second gate electrode insulating layer is from 100 nm to 500 nm.

Further, in other embodiments, the active layer has at least one or at least two of a zinc oxide material, an indium zinc oxide material, and an indium zinc gallium oxide material. A range of a thickness of the active layer is from 100 nm to 200 nm.

Further, in other embodiments, the planarization layer has a silicon oxide material or a silicon nitride material. A range of a thickness of the planarization layer is from 150 nm to 400 nm. The pixel electrode layer has an indium tin oxide material. A range of a thickness of the pixel electrode layer is from 30 nm to 100 nm.

Further, in other embodiments, the substrate has a polyimide material.

Further, in other embodiments, the source or drain electrode layer has an aluminum material, a molybdenum material, or a combination thereof. A range of a thickness of the source or drain electrode layer is from 20 nm to 600 nm.

In order to achieve the aforementioned object, the present disclosure further provides a method of manufacturing the array substrate including:

a step S1 of providing a substrate; a step S2 of depositing a gate electrode insulating material on the substrate to form a first gate electrode insulating film; a step S3 of patterning the first gate electrode insulating film to form a first gate electrode insulating layer, wherein the first gate electrode insulating layer has a recess therein; a step S4 of depositing a gate electrode material on the first gate electrode insulating layer, and forming a gate electrode film in the recess; a step S5 of wet etching the gate electrode film to remove the gate electrode film on the first gate electrode insulating layer, and form a gate electrode layer in the recess; a step S6 of depositing a gate electrode insulating material on the first gate electrode insulating layer and the gate electrode layer to form a second gate electrode insulating layer; and a step S7 of forming an active layer on the second gate electrode insulating layer.

The gate electrode insulating layers are manufactured in two steps, thereby lowering a risk of worse step coverage caused by one-step manufacturing for related art.

The thickness of the second gate electrode insulating layer is related to electrical characteristics of the array substrate. By controlling a ratio of the thickness of the first gate electrode insulating layer and the thickness of the second gate electrode insulating layer, an ON-state current of the array substrate is ensured not to decrease, thereby lowering a risk of an insufficient panel charging rate.

Further, in other embodiments, in the step S2 and the step S6, the gate electrode insulating material is deposited using a plasma enhanced chemical vapor deposition method.

Further, in other embodiments, before the step S6, the method further includes a step S100 of processing the first gate electrode insulating layer using at least one or at least two of hydrogen, nitrogen, ammonia, and argon. Through the step S100, it is ensured that no fault occurs between the first gate electrode insulating layer and the second gate electrode insulating layer, and that optical characteristics of a pixel region do not worsen.

Further, in other embodiments, after the step S7, the method further includes: a step S8 of forming a source or drain electrode layer on the active layer; a step S9 of forming a planarization layer on the source or drain electrode layer; and a step S10 of forming a pixel electrode layer on the planarization layer.

Advantageous effects are as follows.

Compared to the related art, the advantageous effects of the present disclosure are as follows. The present disclosure provides the array substrate and manufacturing method thereof. The gate electrode insulating layers are manufactured in two steps, thereby lowering the risk of the worse step coverage caused by the one-step manufacturing for the related art. The thickness of the second gate electrode insulating layer is related to the electrical characteristics of the array substrate. By controlling the ratio of the thickness of the first gate electrode insulating layer and the thickness of the second gate electrode insulating layer, the ON-state current of the array substrate is ensured not to decrease, thereby lowering the risk of the insufficient panel charging rate.

BRIEF DESCRIPTION OF THE SEVERAL VIEWS OF THE DRAWINGS

In order to describe a technical solution in embodiments or related art more clearly, drawings required to be used by the embodiments or the related art are briefly introduced below. Obviously, the drawings in the description below are only some embodiments of the present disclosure. With respect to persons of ordinary skill in the art, under a premise that inventive efforts are not made, other drawings may be obtained based on these drawings.

DRAWING LABELS array substrate 200;
substrate 10;
first gate electrode insulating film 211; first gate electrode insulating layer 21; recess 11;
gate electrode film 31; gate electrode layer 30;
second gate electrode insulating layer 22;
active layer 40;
source or drain electrode 50;
planarization layer 60;
pixel electrode layer 70;

DESCRIPTION OF SPECIFIC EMBODIMENTS OF THE INVENTION

Technical solutions in the embodiments of the present disclosure are clearly and completely described below in conjunction with the drawings in the embodiments of the present disclosure. Obviously, the described embodiments are only a portion of the embodiments of the present disclosure, not all of the embodiments. Based on the embodiments of the present disclosure, other embodiments obtained under a premise that inventive efforts are not made by persons of ordinary skill in the art are within the protection scope of the present disclosure.

Specific structures and functional details disclosed herein are merely representative, and are used for a purpose of describing exemplary embodiments of the present disclosure. The present disclosure may be embodied in many alternative forms and should not be interpreted as merely limited to the embodiments described herein.

Figure 1:
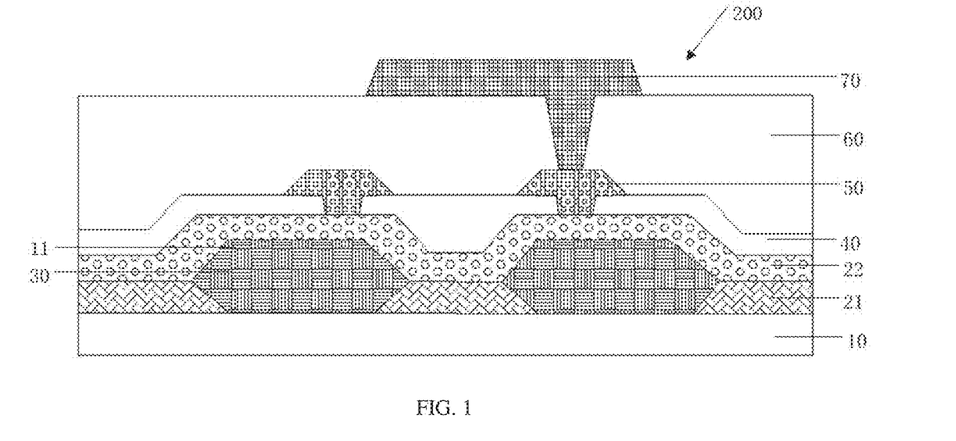
FIG. 1 is a schematic structural diagram illustrating an array substrate provided by a first embodiment of the present disclosure.

As illustrated in FIG. 1, in a first embodiment of the present disclosure, an array substrate 200 includes a substrate 10, a first gate electrode insulating material 21, a gate electrode layer 30, a second gate electrode insulating layer 22, and an active layer 40. Specifically, the first gate electrode insulating layer 21 is disposed on the substrate 10, wherein the first gate electrode insulating layer 21 has a recess 11 therein. The gate electrode layer 30 is disposed in the recess 11 of the first gate electrode insulating layer 21. The second gate electrode insulating layer 22 covers the first gate electrode insulating layer 21 and the gate electrode layer 30. The active layer 40 is disposed on the second gate electrode insulating layer 22.

The substrate 10 has a polyimide (PI) material. That is, a PI thin film is used as a base of the array substrate. The PI thin film has a thin film insulating material which has better performance in the world, and has stronger tensile strength. The PI thin film is formed by polycondensating pyromellitic dianhydride (PMDA) and diaminodiphenyl ether (DDE) in a strong polar solvent, film casting, and then imidizing.

The gate electrode layer 30 has a copper (Cu) material. A range of a thickness of the gate electrode layer 30 is from 200 nm to 5000 nm.

Each of the first gate electrode insulating layer 21 and the second gate electrode insulating layer 22 has at least one or at least two of a corresponding nitrogen oxide material, a corresponding silicon oxide material, and a corresponding silicon nitride material. A range of a thickness of the first gate electrode insulating layer 21 is from 100 nm to 500 nm, and a range of a thickness of the second gate electrode insulating layer 22 is from 100 nm to 500 nm.

The active layer 40 has at least one or at least two of a zinc oxide material, an indium zinc oxide material, and an indium zinc gallium oxide material. A range of a thickness of the active layer 40 is from 100 nm to 200 nm.

A source or drain electrode layer 50 is disposed on the active layer 40. A planarization layer 60 is disposed on the source or drain electrode layer 50. A pixel defined layer 70 is disposed on the planarization layer 60.

The source or drain electrode layer 50 has an aluminum material, a molybdenum material, or a combination thereof. A range of a thickness of the source or drain electrode layer 50 is from 20 nm to 600 nm. The planarization layer 60 has a silicon oxide material or a silicon nitride material. A range of a thickness of the planarization layer 60 is from 150 nm to 400 nm. The pixel electrode layer 70 has an indium tin oxide material. A range of a thickness of the pixel electrode layer 70 is from 30 nm to 100 nm.

In order to more clearly explain design points, the present embodiment also provides a manufacturing method for manufacturing the array substrate of the present disclosure.

Figure 2:
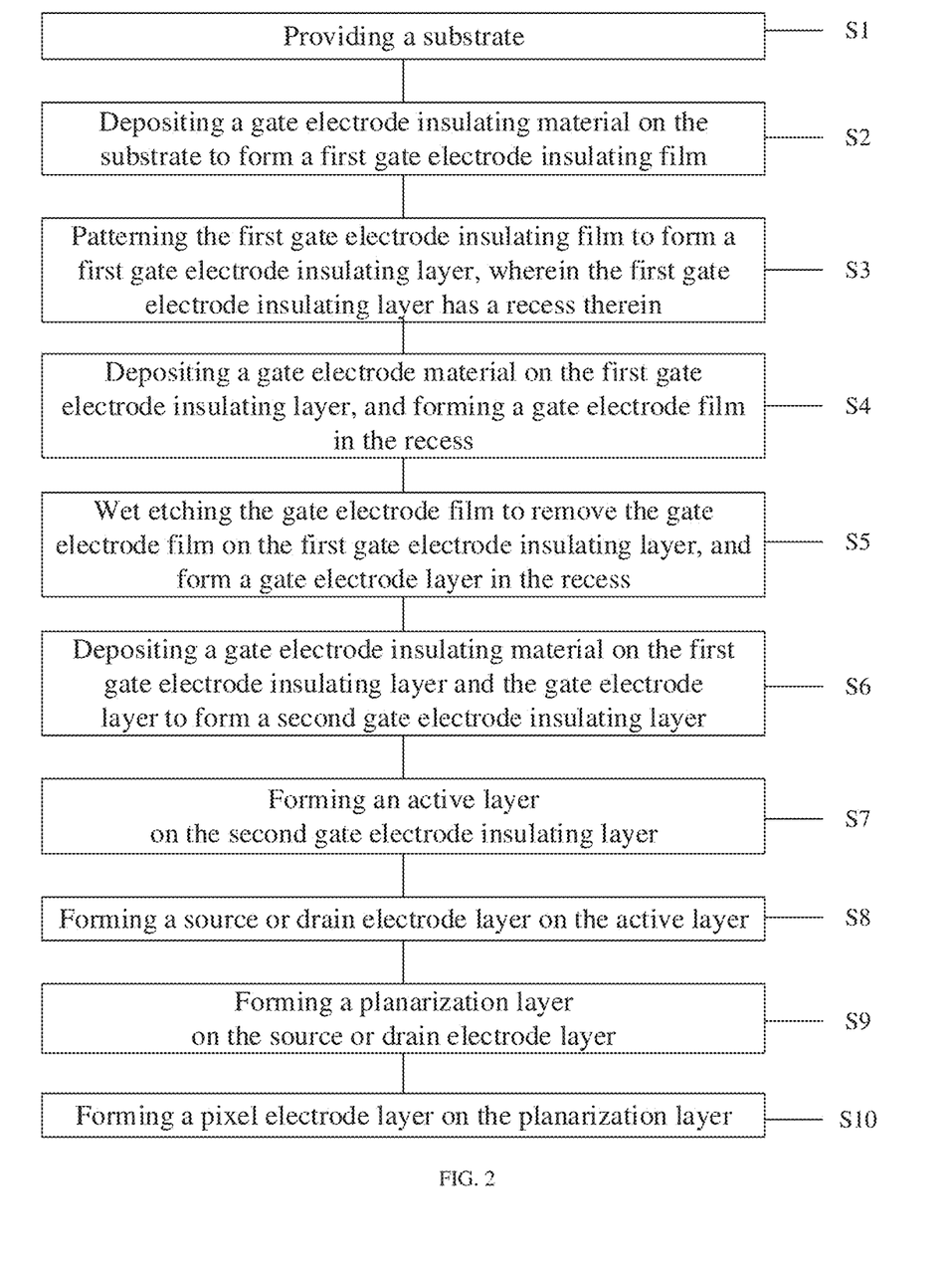
FIG. 2 is a flowchart illustrating a method of manufacturing the array substrate of the first embodiment of the present disclosure.

Referring to FIG. 2, FIG. 2 is a flowchart illustrating the method of manufacturing the array substrate of the present embodiment, which includes a step S1 to a step S10.

Figure 3:
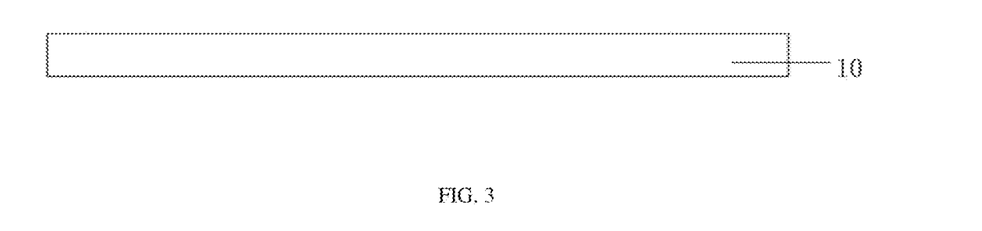
FIG. 3 is a schematic structural diagram illustrating an array substrate in a step S1 of the manufacturing method of the first embodiment of the present disclosure.

Referring to FIG. 3, FIG. 3 is a schematic structural diagram illustrating an array substrate in the step S1 of the manufacturing method of the present embodiment. In the step S1, a substrate 10 is provided.

Figure 4:
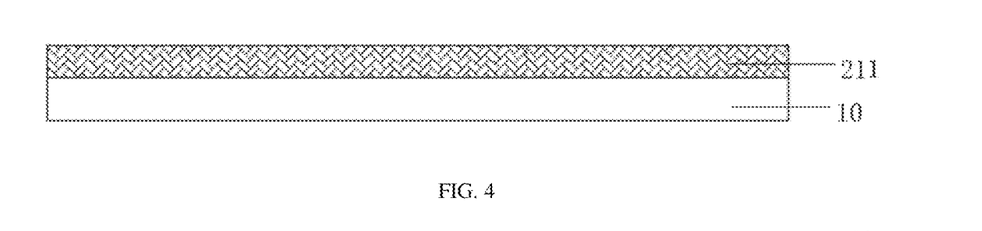
FIG. 4 is a schematic structural diagram illustrating an array substrate in a step S2 of the manufacturing method of the first embodiment of the present disclosure.

Referring to FIG. 4, FIG. 4 is a schematic structural diagram illustrating an array substrate in a step S2 of the manufacturing method of the present embodiment. In the step S2, a gate electrode insulating material is deposited on the substrate 10 to form a first gate electrode insulating film 211.

The first gate electrode insulating material is deposited using a plasma enhanced chemical vapor deposition method.

Figure 5:
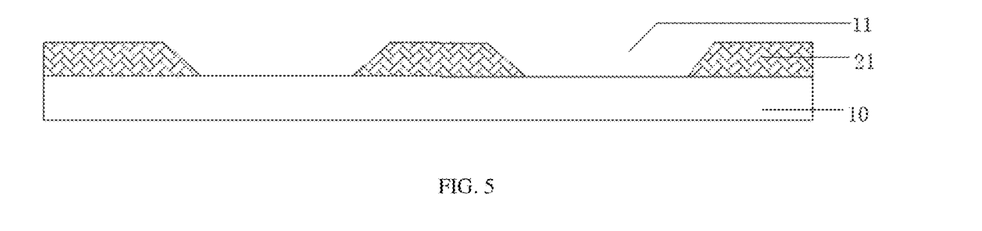
FIG. 5 is a schematic diagram illustrating a structure in a step S3 of the manufacturing method of the first embodiment of the present disclosure.

Referring to FIG. 5, FIG. 5 is a schematic structural diagram illustrating an array substrate in a step S3 of the method of manufacturing the array substrate of the present embodiment. In the step S3, the first gate electrode insulating film 211 is patterned to form a first gate electrode insulating layer 21. The first gate electrode insulating layer 21 has a recess 11 therein.

The first gate electrode insulating layer 21 has at least one or at least two of a nitrogen oxide material, a silicon oxide material, and a silicon nitride material. A range of a thickness of the first gate electrode insulating layer 21 is from 100 nm to 500 nm.

Figure 6:
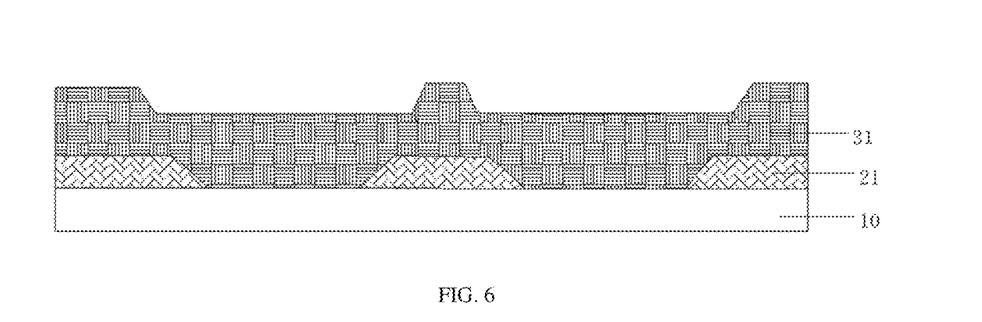
FIG. 6 is a schematic structural diagram illustrating an array substrate in a step S4 of the manufacturing method of the first embodiment of the present disclosure.

Referring to FIG. 6, FIG. 6 is a schematic structural diagram illustrating an array substrate in a step S4 of the method of manufacturing the array substrate of the present embodiment. In the step S4, a gate electrode material is deposited on the first gate electrode insulating layer 21. A gate electrode film 31 is formed in the recess.

Figure 7:
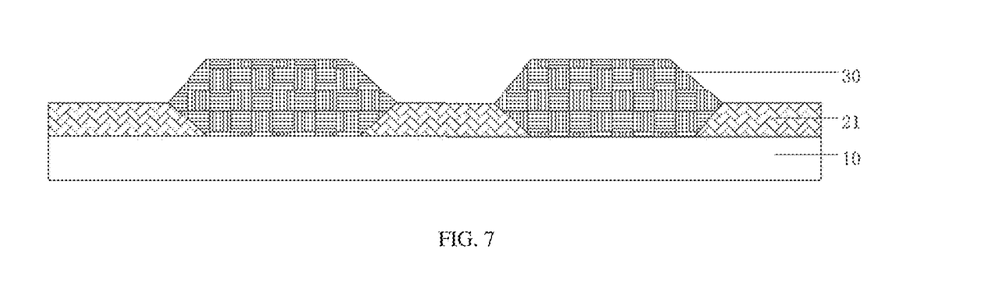
FIG. 7 is a schematic structural diagram illustrating an array substrate in a step S5 of the manufacturing method of the first embodiment of the present disclosure.

Referring to FIG. 7, FIG. 7 is a schematic structural diagram illustrating an array substrate in a step S5 of the method of manufacturing the array substrate of the present embodiment. In step S5, the gate electrode film 31 is wet etched to remove the gate electrode film 31 on the first gate electrode insulating layer 21, and a gate electrode layer 30 is formed in the recess. The gate electrode layer 30 has a Cu material. A range of a thickness of the gate electrode layer 30 is from 200 nm to 5000 nm.

Figure 8:
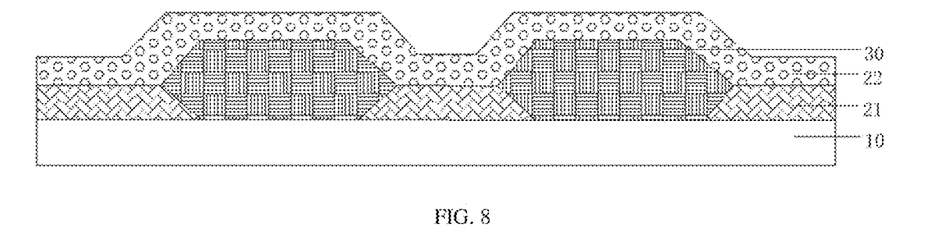
FIG. 8 is a schematic structural diagram illustrating an array substrate in a step S6 of the manufacturing method of the first embodiment of the present disclosure.

Referring to FIG. 8, FIG. 8 is a schematic structural diagram illustrating an array substrate in a step S6 of the method of manufacturing the array substrate of the present embodiment. In the step S6, a gate electrode insulating material is deposited on the first gate electrode insulating layer 21 and the gate electrode layer 30 to form a second gate electrode insulating layer 22.

Before the step S6, the method further includes processing the first gate electrode insulating layer 21 using at least one or at least two of hydrogen, nitrogen, ammonia, and argon. In this way, a film quality difference between the first gate electrode insulating layer 21 and the second gate electrode insulating layer 22 is reduced, thereby preventing the film quality difference from being too large, causing film quality characteristics such as electrical characteristics and optical characteristics of the insulating layers to worsen. It is ensured that no fault occurs between the first gate electrode insulating layer 21 and the second gate electrode insulating layer 22, and that optical characteristics of a pixel region do not worsen.

The second gate electrode insulating layer 22 is deposited using a plasma enhanced chemical vapor deposition method. The second gate electrode insulating layer 22 has at least one or at least two of a nitrogen oxide material, a silicon oxide material, and a silicon nitride material. A range of a thickness of the second gate electrode insulating layer 22 is from 100 nm to 500 nm.

The gate electrode insulating layers are manufactured in two steps, thereby lowering a risk of worse step coverage caused by one-step manufacturing for related art.

The thickness of the second gate electrode insulating layer 22 is related to electrical characteristics of the array substrate. By controlling a ratio of the thickness of the first gate electrode insulating layer 21 and the thickness of the second gate electrode insulating layer 22, an ON-state current of the array substrate is ensured not to decrease, thereby lowering a risk of an insufficient panel charging rate.

Figure 9:
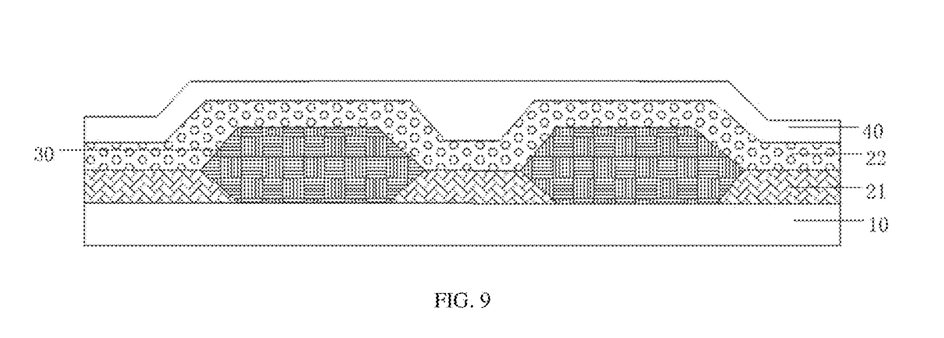
FIG. 9 is a schematic structural diagram illustrating an array substrate in a step S7 of the manufacturing method of the first embodiment of the present disclosure.

Referring to FIG. 9, FIG. 9 is a schematic structural diagram illustrating an array substrate in a step S7 of the method of manufacturing the array substrate of the present embodiment. In the step S7, an active layer 40 is formed on the second gate electrode insulating layer 22. The active layer 40 has at least one or at least two of a zinc oxide material, an indium zinc oxide material, and an indium zinc gallium oxide material. A range of a thickness of the active layer 40 is from 100 nm to 200 nm.

Figure 10:
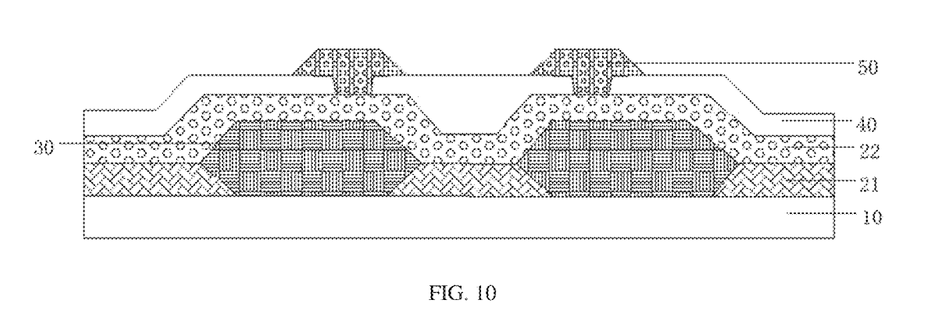
FIG. 10 is a schematic structural diagram illustrating an array substrate in a step S8 of the manufacturing method of the first embodiment of the present disclosure.

Referring to FIG. 10, FIG. 10 is a schematic structural diagram illustrating an array substrate in a step S8 of the method of manufacturing the array substrate of the present embodiment. In the step S8, a source or drain electrode layer 50 is formed on the active layer 40. The source or drain electrode layer 50 has an aluminum material, a molybdenum material, or a combination thereof. A range of a thickness of the source or drain electrode layer 50 is from 20 nm to 600 nm.

Figure 11:
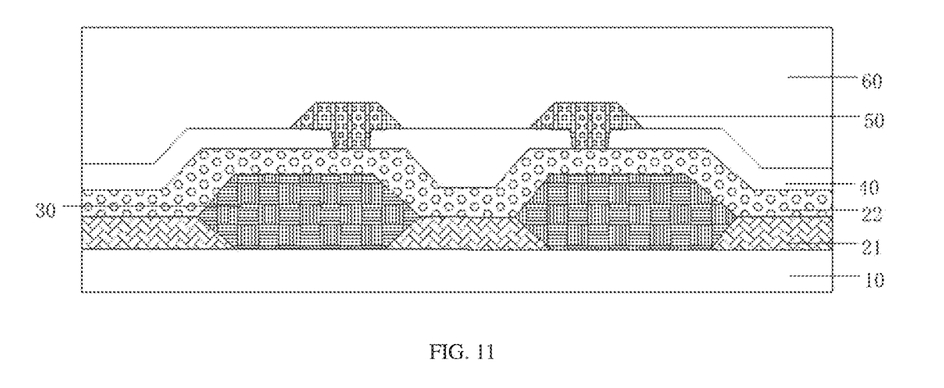
FIG. 11 is a schematic structural diagram illustrating an array substrate in a step S9 of the manufacturing method of the first embodiment of the present disclosure.

Referring to FIG. 11, FIG. 11 is a schematic structural diagram illustrating an array substrate in a step S9 of the method of manufacturing the array substrate of the present embodiment. In the step S9, a planarization layer 60 is formed on the source or drain electrode layer 50. The planarization layer 60 has a silicon oxide material or a silicon nitride material. A range of a thickness of the planarization layer 60 is from 150 nm to 400 nm.

Figure 12:
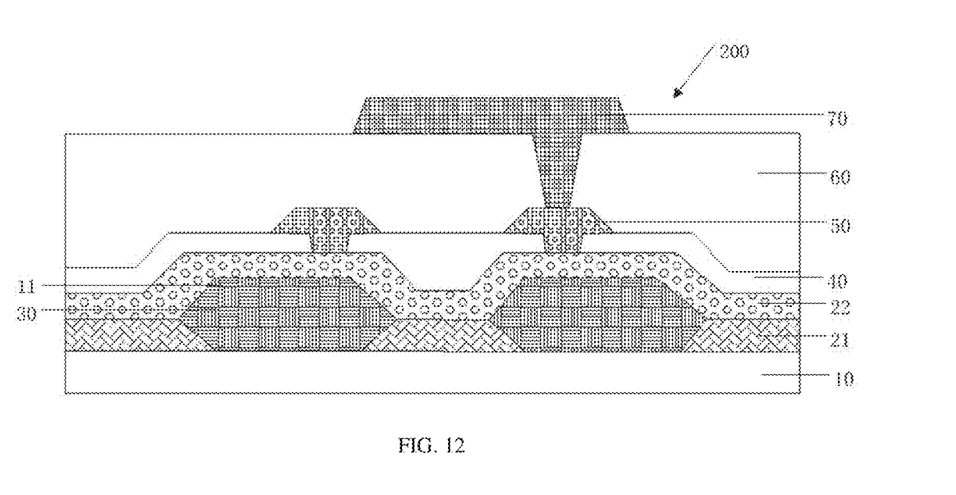
FIG. 12 is a schematic structural diagram illustrating an array substrate in a step S10 of the manufacturing method of the first embodiment of the present disclosure.

Referring to FIG. 12, FIG. 12 is a schematic structural diagram illustrating an array substrate in a step S10 of the method of manufacturing the array substrate of the present embodiment. In the step S10, a pixel electrode layer 70 is formed on the planarization layer 60. The pixel electrode layer 70 has an indium tin oxide material. A range of a thickness of the pixel electrode layer 70 is from 30 nm to 100 nm.

The advantageous effects of the present disclosure are as follows. The present disclosure provides the array substrate and manufacturing method thereof. The gate electrode insulating layers are manufactured in two steps, thereby lowering the risk of the worse step coverage caused by the one-step manufacturing for the related art. The thickness of the second gate electrode insulating layer is related to the electrical characteristics of the array substrate. By controlling the ratio of the thickness of the first gate electrode insulating layer and the thickness of the second gate electrode insulating layer, the ON-state current of the array substrate is ensured not to decrease, thereby lowering the risk of the insufficient panel charging rate.

The above is only the preferred embodiments of the present disclosure. It is noted that persons of ordinary skill in the art may carry out many changes and modifications without departing from the principles of the present disclosure. These changes and modifications should be included in the protection scope of the present disclosure.

What is claimed is:

1. An array substrate, comprising:
    a substrate;
    a first gate electrode insulating layer disposed on the substrate, wherein the first gate electrode insulating layer has a recess therein;
    a gate electrode layer disposed in the recess of the first gate electrode insulating layer, wherein a thickness of the gate electrode layer is larger than a thickness of the recess;
    a second gate electrode insulating layer covering the first gate electrode insulating layer and the gate electrode layer, wherein the second gate electrode insulating layer has a step coverage over the gate electrode layer not in the recess; and
    an active layer disposed on the second gate electrode insulating layer.

2. The array substrate of claim 1, wherein the gate electrode layer has a copper material; and wherein a range of a thickness of the gate electrode layer is from 200 nm to 5000 nm.

3. The array substrate of claim 1, wherein each of the first gate electrode insulating layer and the second gate electrode insulating layer has at least one or at least two of a corresponding nitrogen oxide material, a corresponding silicon oxide material, and a corresponding silicon nitride material; and wherein a range of a thickness of the first gate electrode insulating layer is from 100 nm to 500 nm, and a range of a thickness of the second gate electrode insulating layer is from 100 nm to 500 nm.

4. The array substrate of claim 1, wherein the active layer has at least one or at least two of a zinc oxide material, an indium zinc oxide material, and an indium zinc gallium oxide material; and wherein a range of a thickness of the active layer is from 100 nm to 200 nm.

5. The array substrate of claim 1, further comprising:
    a source or drain electrode layer disposed on the active layer;
    a planarization layer disposed on the source or drain electrode layer; and
    a pixel defined layer disposed on the planarization layer.

6. The array substrate of claim 5, wherein the planarization layer has a silicon oxide material or a silicon nitride material; and wherein a range of a thickness of the planarization layer is from 150 nm to 400 nm; wherein the pixel electrode layer has an indium tin oxide material; and wherein a range of a thickness of the pixel electrode layer is from 30 nm to 100 nm.

7. A method of manufacturing an array substrate, comprising:
    a step S1 of providing a substrate;
    a step S2 of depositing a gate electrode insulating material on the substrate to form a first gate electrode insulating film;
    a step S3 of patterning the first gate electrode insulating film to form a first gate electrode insulating layer, wherein the first gate electrode insulating layer has a recess therein;
    a step S4 of depositing a gate electrode material on the first gate electrode insulating layer, and forming a gate electrode film in the recess;
    a step S5 of wet etching the gate electrode film to remove the gate electrode film on the first gate electrode insulating layer, and form a gate electrode layer in the recess, wherein a thickness of the gate electrode layer is larger than a thickness of the recess;
    a step S6 of depositing a gate electrode insulating material on the first gate electrode insulating layer and the gate electrode layer to form a second gate electrode insulating layer, wherein the second gate electrode insulating layer has a step coverage over the gate electrode layer not in the recess; and
    a step S7 of forming an active layer on the second gate electrode insulating layer.

8. The method of claim 7, wherein in the step S2 and the step S6, the gate electrode insulating material is deposited using a plasma enhanced chemical vapor deposition method.

9. The method of claim 7, wherein before the step S6, the method further comprises a step S100 of processing the first gate electrode insulating layer using at least one or at least two of hydrogen, nitrogen, ammonia, and argon.

10. The method of claim 7, wherein the gate electrode layer has a copper material; and wherein a range of a thickness of the gate electrode layer is from 200 nm to 5000 nm.

11. The method of claim 7, wherein each of the first gate electrode insulating layer and the second gate electrode insulating layer has at least one or at least two of a corresponding nitrogen oxide material, a corresponding silicon oxide material, and a corresponding silicon nitride material; and wherein a range of a thickness of the first gate electrode insulating layer is from 100 nm to 500 nm, and a range of a thickness of the second gate electrode insulating layer is from 100 nm to 500 nm.

12. The method of claim 7, wherein the active layer has at least one or at least two of a zinc oxide material, an indium zinc oxide material, and an indium zinc gallium oxide material; and wherein a range of a thickness of the active layer is from 100 nm to 200 nm.

13. The method of claim 7, further comprising:
    disposing a source or drain electrode layer on the active layer;
    disposing a planarization layer on the source or drain electrode layer; and
    disposing a pixel defined layer on the planarization layer.

14. The method of claim 13, wherein after the step S7, the method further comprises:
- a step S8 of forming a source or drain electrode layer on the active layer;
- a step S9 of forming a planarization layer on the source or drain electrode layer; and
- a step S10 of forming a pixel electrode layer on the planarization layer.

15. The method of claim 13, wherein the planarization layer has a silicon oxide material or a silicon nitride material; and wherein a range of a thickness of the planarization layer is from 150 nm to 400 nm; wherein the pixel electrode layer has an indium tin oxide material; and wherein a range of a thickness of the pixel electrode layer is from 30 nm to 100 nm.

* * * * *